(12) United States Patent
Oda

(10) Patent No.: US 6,559,542 B1
(45) Date of Patent: May 6, 2003

(54) SEMICONDUCTOR DEVICE AND METHOD OF MANUFACTURING THE SAME

(75) Inventor: Noriaki Oda, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/615,328

(22) Filed: Jul. 12, 2000

(30) Foreign Application Priority Data

Jul. 13, 1999 (JP) .............................. 11-199593

(51) Int. Cl.[7] .................................. H01L 23/48
(52) U.S. Cl. ........................ 257/758; 257/760
(58) Field of Search .............. 257/758, 759, 257/760, 761, 763, 764, 765

(56) References Cited

U.S. PATENT DOCUMENTS

| 5,691,572 A | * | 11/1997 | Chung ................... 257/751 |
| 5,760,429 A | * | 6/1998 | Yano et al. ................. 257/211 |
| 5,872,066 A | * | 2/1999 | Fang et al. ................. 438/787 |
| 5,989,983 A | * | 11/1999 | Goo et al. .................. 438/473 |
| 6,133,619 A | * | 10/2000 | Sahota et al. ............... 257/649 |
| 6,140,225 A | * | 10/2000 | Usami et al. ............... 438/637 |
| 6,153,512 A | * | 11/2000 | Chang et al. ............... 438/624 |
| 6,180,514 B1 | * | 1/2001 | Yeh et al. .................. 438/633 |

FOREIGN PATENT DOCUMENTS

| JP | A 4-188753 | 7/1992 |
| JP | A 6-326050 | 11/1994 |
| JP | A 9-82810 | 3/1997 |
| JP | A 9-186158 | 7/1997 |
| JP | A 10-73834 | 3/1998 |
| JP | A 10-107026 | 4/1998 |

* cited by examiner

Primary Examiner—T. N. Quach
(74) Attorney, Agent, or Firm—Young & Thompson

(57) ABSTRACT

Sides of via hole do not bow horizontally, thereby preventing an increase of a resistance of a wiring layer connected to a conductor in the via hole. A semiconductor device comprises a first wiring layer, an insulating layer over the first wiring, a second wiring on the insulating layer, a first hole formed in the first wiring, a second hole formed in the insulating layer connecting with at least a part of the first hole, and a conductive material in first and second holes that electrically connects the first wiring layer to the second wiring layer.

15 Claims, 5 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly to a semiconductor device and a method of manufacturing the same in which resistance of a wiring layer having a large area is not increased.

2. Description of the Related Art

As the size of wiring formations decrease, there is a tendency for the wiring intervals to become narrower, the wiring capacitance to increase, and the operating speed of the circuit to decrease. In order to prevent such a tendency, various kinds of interlayer films of low dielectric constant have been proposed. In FIG. 10, a related art which uses HSQ (Hydrogen Silsesquioxane) as an interlayer insulating film is shown. As shown in FIG. 10, a first oxide film 102 is formed on a substrate (not shown) and a first wiring layer 101 is formed on the oxide film 102. A liner oxide film 106, a HSQ film 107 and a plasma oxide film 108 are formed over the first wiring layer 101 together form an interlayer insulator. A second wiring layer 113 on the oxide film 108 is connected to the first wiring layer 101 by a tungsten plug 112, which is formed in a via hole 109. According to this related art, the HSQ film in the interlayer insulator, prevents the wiring resistance from increasing.

However, in this related art, a cavity 100 forms in the sides of via hole 109 when etching through the interlayer insulator. The HSQ 107 is horizontally etched so that the sides of via hole 109 bow outwardly. In this event, via hole 109 is not completely filled with tungsten, leaving cavity 100 around the tungsten plug 112. As a result, the absence of HSQ around the via hole causes the resistance to increase.

Specifically, when the wiring layers cover a large area, the sides of the via hole are more easily swelled into the bow shape. The reason is that an application film, such as HSQ, is easily formed in a thick layer on the wiring layer having a large area. In order to perfectly bore the via hole in the interlayer insulator that includes the thick HSQ film, the etching is carried out so that the bottom of the via hole 109 exposes the underlying wiring layer 101, once the wiring layer 101 is exposed, the etching does not progress downwardly, but progresses horizontally in the HSQ film 107. When the etching rate of the HSQ is higher than that of any of the layers, the bowing of the sides of the via hole 109 occurs.

Thus, it is desirable to prevent the horizontal spreading of the via hole in order to prevent the resistance from increasing.

SUMMARY OF THE INVENTION

Therefore, the object of the present invention is to solve the above problem.

In order to accomplish this object, according to a first aspect of the present invention, there is provided a semiconductor device comprising a first wiring layer, an insulating layer over the first wiring layer, a second wiring layer on the insulating layer, a first hole formed in the first wiring layer, a second hole formed in the insulating layer connecting with at least a part of the first hole, and a conductive material in the first and second holes that electrically connects the first wiring layer to the second wiring layer.

According to a second aspect of the present invention, there is provided a method of manufacturing a semiconductor device comprising, forming a first wiring layer, forming a first hole in the first wiring layer, forming an insulating layer on the wiring layer and in the first hole, forming a second hole in the insulating layer, the second hole exposing at least a part of an inner side surface of the first hole, and filling the second hole with a conductive material.

According to a third aspect of the present invention, there is provided a method of avoiding of over-etching of an insulator layer, comprising, forming a first horizontal wiring layer, forming a first hole in the first wiring layer, forming an insulating layer on the wiring layer and in the first hole, etching a second hole in the insulating layer, the second hole exposing at least a part of an inner side surface of the first hole, the first hole having a depth that avoids horizontal over-etching of the insulating layer above the first hole when forming the second hole, and filling the second hole with a conductive material.

According to the present invention, the second hole is preventing from horizontally swelling. Therefore, a resistance of the wiring layer does not increase.

BRIEF DESCRIPTION OF THE DRAWINGS

The above and other objects as well as advantages of the present invention will become clear by the following description of the preferred embodiments of the present invention with reference to the accompanying drawings, wherein.

DETAILED DESCRIPTION OF THE PREFERRED EMBODIMENTS

Figure 1:
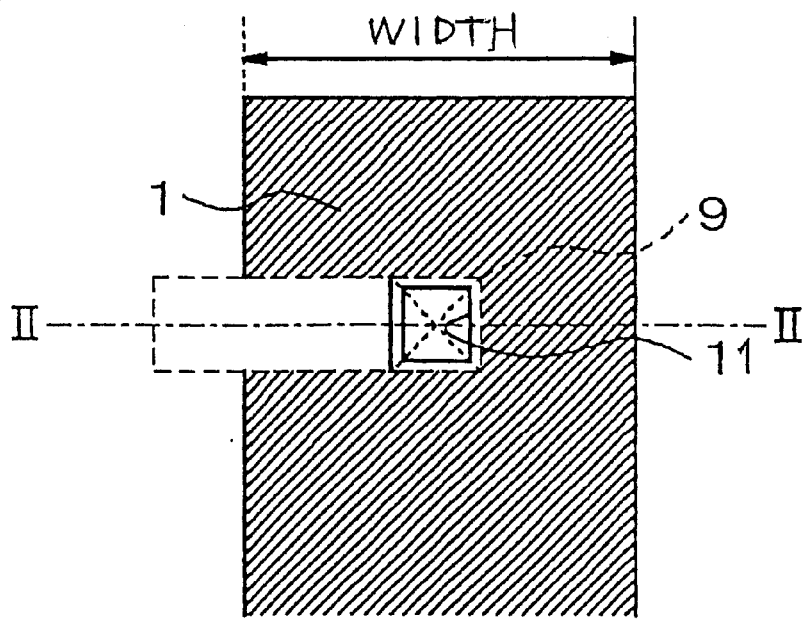
FIG. 1 is a plan view showing the structure of an embodiment of a semiconductor device according to the present invention.
Figure 2:
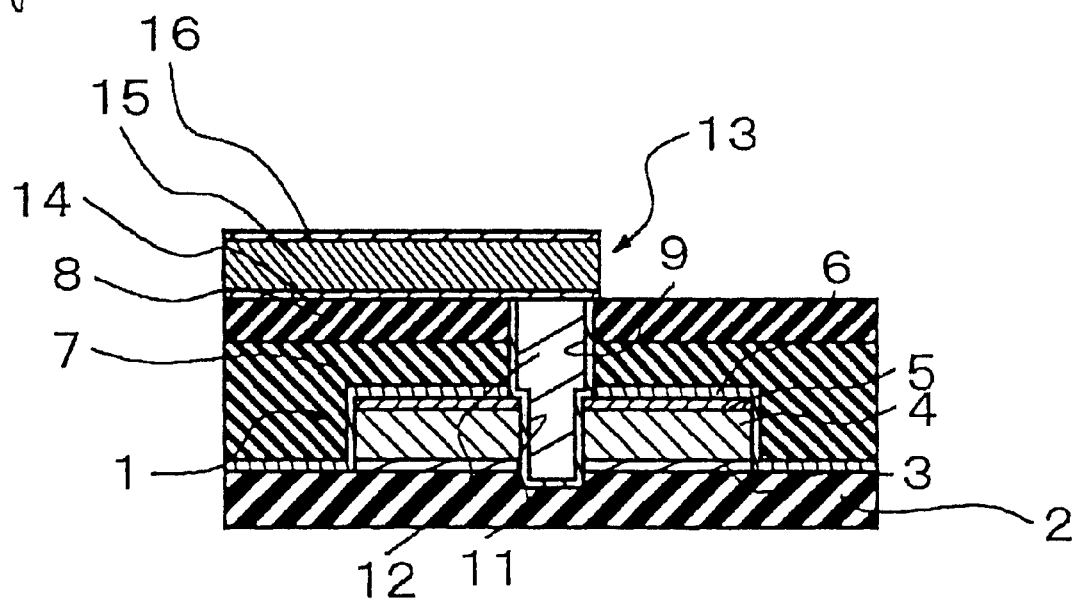
FIG. 2 is a cross sectional view taken along the line II—II in FIG. 1.

The width of a underlying wiring layer 1 shown in FIG. 1, is equal to or larger than 250 μm. This is considered to provide a large area for the wiring layer, when the wiring layer extends at least a similar distance in a perpendicular direction. As shown in FIG. 2, a first oxide film 2 is formed on the upper surface of a substrate (not shown). The thickness of the first oxide film 2 is about 800 nm. The first wiring layer 1 is formed on the upper surface of the first oxide film 2.

The first wiring layer 1 has three layers, i.e., in the order from the lowest layer, a barrier metal layer 3 about 80 nm thick, an aluminum layer 4 about 400 nm thick, and an antireflection film 5 about 70 nm thick. The barrier metal layer 3, in the order from the lowest layer, has a titanium layer with about 30 nm thickness and a titanium nitride layer with about 50 nm thickness. Also, the antireflection film 5, in the order from the lowest layer, has a titanium layer with about 50 nm thickness and a titanium nitride layer with about 20 nm thickness.

A liner oxide film 6 is formed on the surface of the underlying wiring layer 1. In this connection, the liner oxide film 6 is formed of a plasma oxide film about 50 nm thick. An HSQ (Hydrogen Silsesquioxane) layer 7 is formed on the liner oxide film. A plasma oxide film 8 is formed on the HSQ layer 7. The liner oxide film 6, the HSQ layer 7 and the plasma oxide film 8 constitute an interlayer insulator.

A first hole 9 is formed through the interlayer insulator. A second hole 11 is formed in the underlying wiring layer 1 and is an extension of the first hole 9. Though the depth of the second hole 11 in the underlying wiring layer 1 is arbitrary, the second hole 11 has a sufficient depth to expose a portion of the aluminum layer 4. It is preferable in terms of the etching rate that the effective diameter (or the cross-sectional area) of the second hole 11 is slightly smaller (or narrower) than the effective diameter (or the cross-sectional area) of the first hole.

As an example, if the diameter of the first hole 9 is 0.28 $\mu$m, then the diameter of the second hole 11 is 0.24 $\mu$m. The second hole 11 may extend into the oxide film as shown in FIG. 2, although this is not required.

Tungsten 12 may be used to fill the first hole 9 and the second hole 11. A second wiring layer 13 is formed on the upper surfaces of the tungsten 12 and the, plasma oxide film 8. The second wiring layer 13 has three layers, i.e., in the order from the lowest layer, a barrier metal layer 14, an aluminum layer 15 and an antireflection film 16. The barrier metal layer 14, in the order from the lowest layer, has a titanium layer about 30 nm thick and a titanium nitride layer about 50 nm thick. The antireflection film 16, in the order from the lowest layer, has a titanium layer about 20 nm thick and a titanium nitride layer about 50 nm thick.

Figure 3:
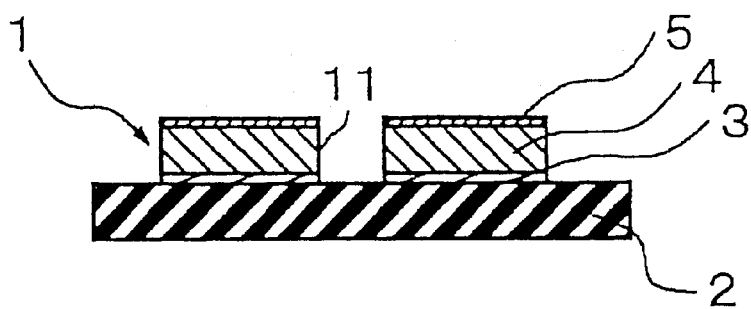
FIG. 3 is a cross sectional view showing an embodiment of a method of manufacturing a semiconductor device according to the present invention.

FIGS. 3 to 6 are cross sectional views respectively showing the steps of a manufacturing method of manufacturing the semiconductor device shown in FIG. 2. As shown in FIG. 3, the first oxide film 2 is formed on the upper surface of a semiconductor device substrate (not shown) so as to have a thickness of 800 nm by utilizing a plasma CVD (Chemical Vapor Deposition) method. Next, the barrier metal layer 3, the aluminum layer 4, and the antireflection film 5 are respectively formed on the upper face of the first oxide film 2 in this order by sputtering.

Next, the three layers which have been formed in the previous process are patterned by photolithography and reactive ion etching to form the underlying wiring layer 1. By carrying out this patterning, the second hole 11 is formed through the underlying wiring layer 1 at the same time.

Figure 4:
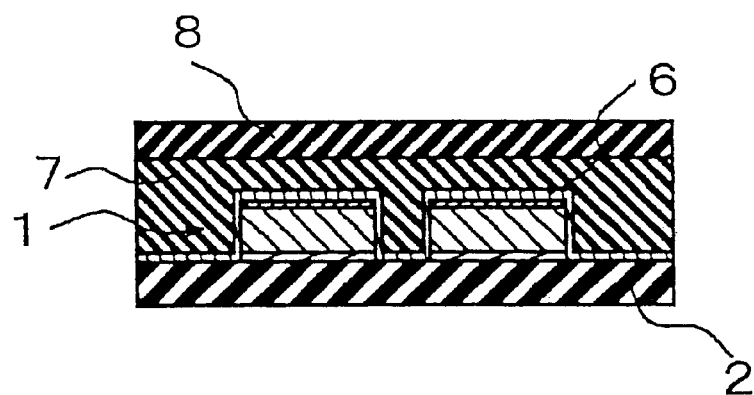
FIG. 4 is a cross sectional view showing a step next to the step shown in FIG. 3.

Next, as shown in FIG. 4, the liner oxide film 6 formed of the plasma oxide film is formed over the underlying wiring layer 1. Next, the HSQ layer 7 is formed over the upper surface of the liner oxide film 6 by utilizing an application and baking technique. Next, the plasma oxide film 8 1,400 nm thick is formed on the upper surface of the HSQ layer 7. Then, the surface of the plasma oxide film 8 is polished by utilizing a CMP (Chemical Mechanical Polishing) method to flatten the surface thereof, thereby adjusting the thickness of the plasma oxide film 8.

Figure 5:
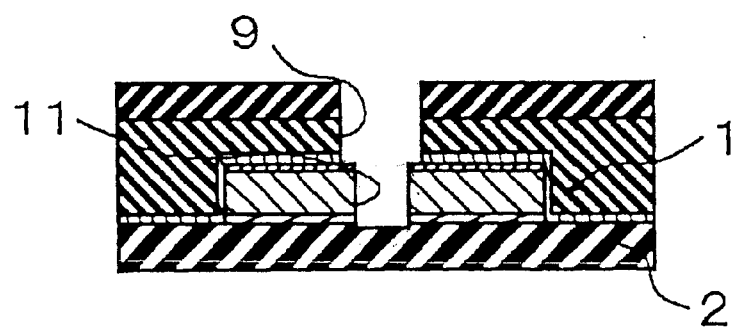
FIG. 5 is a cross sectional view showing a step further next to the step shown in FIG. 4.

Next, as shown in FIG. 5, the first hole 9 is selectively formed by utilizing a photolithography process and reactive ion etching. After completion of the formation of the first hole 9, over-etching is carried out to remove the HSQ layer 7 and the liner oxide film 6 in the second hole 11. The depth of the second hole 11 may be adjusted so that the bowing of the sides of the HSQ 7 does not occur excessively in the first hole 9. According to this method, of the present invention when this over-etching is carried out the etching is allowed to progress downwardly, that is into the second hole 11. Since the etching is allowed to progress downwardly the horizontal etching of the HSQ is avoided, thereby preventing the formation of the cavity around the tungsten plug.

When reactive ion etching the first hole 9 and the second hole 11, $C_4F_8$, Ar, $O_2$ and CO may be collectively employed as the etching gas, the atmospheric pressure may be about 50 mTorr, the temperature may be about 0° C., and the electric power may be about 2,000 W.

Figure 6:
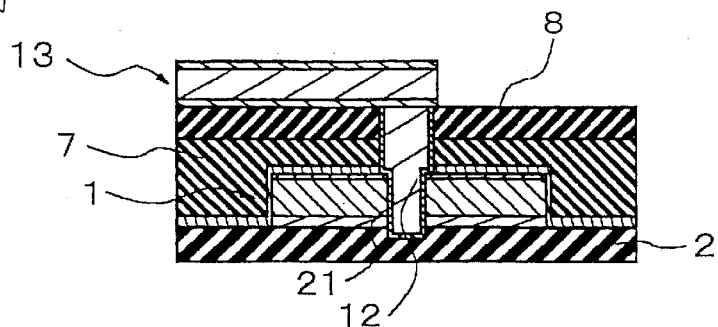
FIG. 6 is a cross sectional view showing a step further next to the step shown in FIG. 5.

Next, as shown in FIG. 6, the inner surfaces of the first hole 9 and the second hole 11 are coated with a titanium nitride layer 21 about 50 nm thick by sputtering. Then, the first hole 9 and the second hole 11 are filled with tungsten 12 by a CVD method. Next, parts of the titanium nitride layer 21 and the tungsten 12 which are formed on the plasma oxide film 8 are removed by a CMP method. Then, the layers 14, 15 and 16 as described above are sequentially formed by sputtering, and finally, those layers are patterned by photolithography and reactive ion etching to form the second wiring layer 13.

By way of further explanation, when the reactive ion etching of the first hole 9 reaches the underlying wiring layer 1, the material that remains to be etched is the wiring layer 1 and the HSQ layer 7 since the etching rate of HSQ is high under the conditions described above, the HSQ layer 7 is more easily etched than the wiring layer and thus the HSQ is etched horizontally.

On the contrary, according to the present invention, during the reactive ion etching of the first hole 9, the HSQ that fills the second hole is etched and sides of the via hole 9 are effectively prevented from being etched horizontally.

Figure 7:
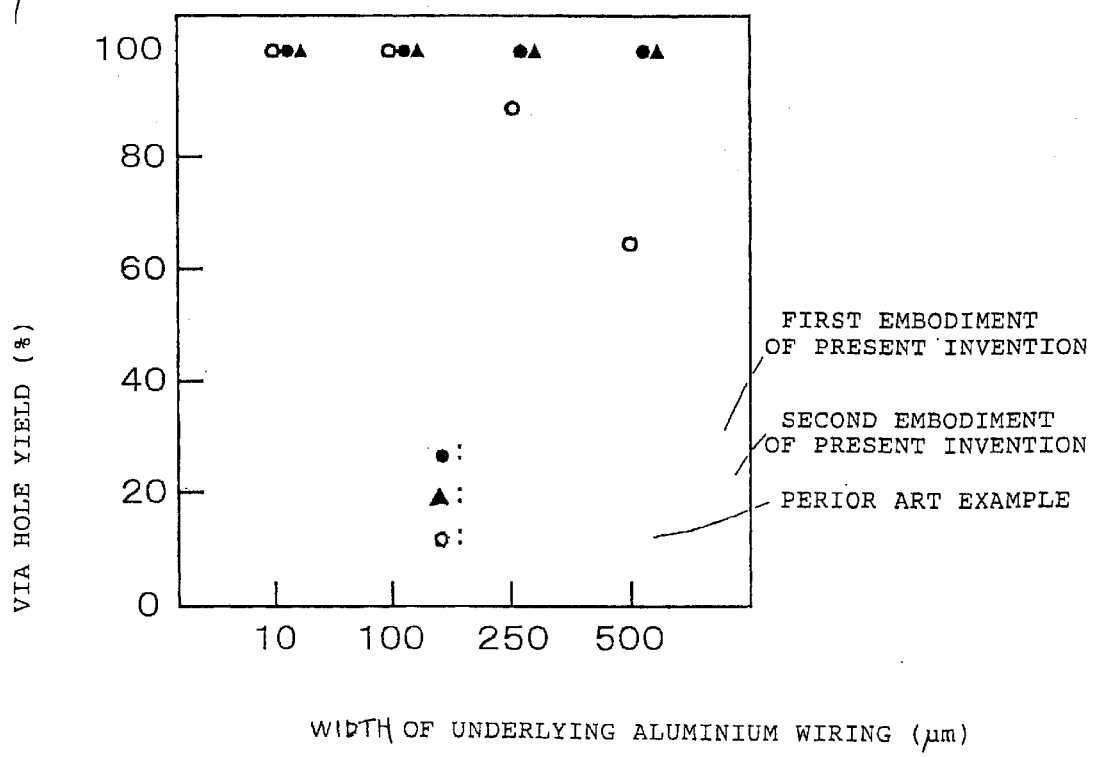
FIG. 7 is a graphical representation showing the confirmation of the effect.

FIG. 7 is a graphical representation showing the effect of the present invention. FIG. 7 shows the relation between the width of the underlying wiring layer 1 and the yield of the via holes. One via hole is present at the center of the underlying aluminum wiring layer 1 and the size thereof is 0.28 $\mu$m. With respect to the yield of the via holes, there is established the standard in which when the via hole resistance (including the wiring resistance) is equal to or lower than 100 ohms, the via hole of interest is judged to be acceptable.

In FIG. 7, the ordinate represents the percentage which is obtained by dividing the number of acceptable chips on a wafer by the total number of chips. As is apparent from FIG. 7, in the case of the prior art example in which the second hole is not provided in the underlying aluminum wiring layer, when a width of the aluminum wiring layer becomes equal to or larger than 250 $\mu$m, the yield of the via holes is abruptly reduced. In the case of the first and second embodiments according to the present invention, it is possible to maintain the yield of 100% over the range shown in FIG. 7.

Figure 8:
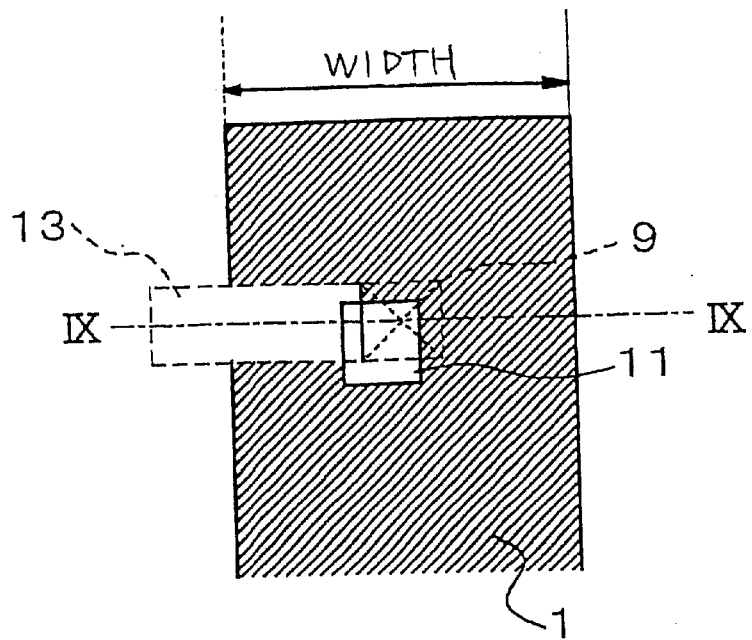
FIG. 8 is a plan view showing the structure of another embodiment of a semiconductor device according to the present invention.
Figure 9:
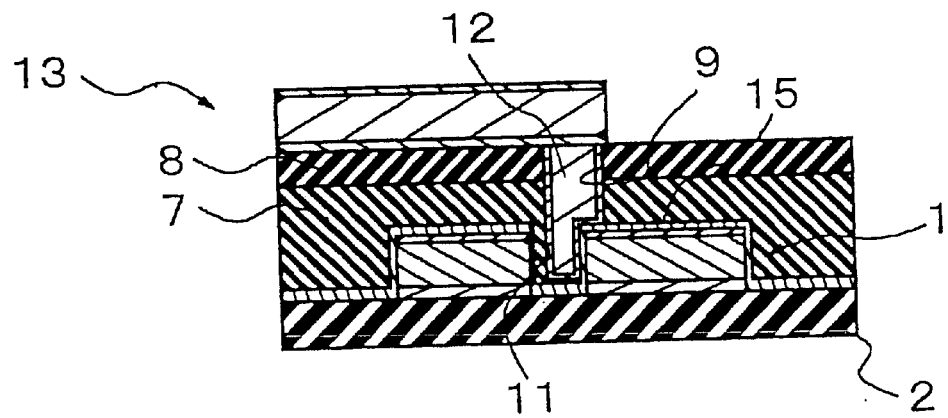
FIG. 9 is a cross sectional view taken along the line IX—IX in FIG. 8.
Figure 10:
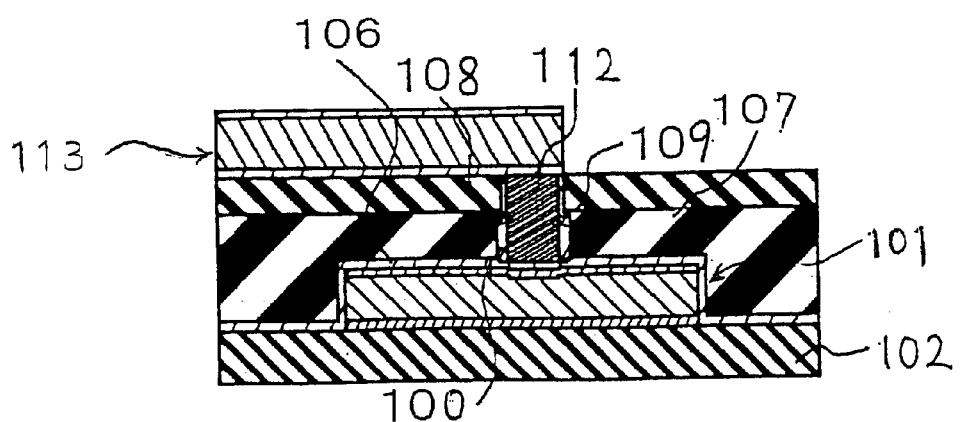
FIG. 10 is a cross sectional view showing the structure of a semiconductor device according to a related art.

FIGS. 8 and 9 show a second embodiment of the semiconductor device according to the present invention. In this embodiment, the cross-sectional area or the effective diameter of the first hole 9 is roughly equal to that of the second hole 11. Both of the first hole 9 and the second hole 11 are slightly shifted horizontally (in the direction intersecting perpendicularly the layer lamination direction). In addition, the second hole 11 is slightly horizontally shifted with respect to the first hole 9 in the range of ¼ to ½ of the effective diameter of the first hole 9. Thereby, the HSQ film 7 remains in a part of the second hole. In this embodiment, the side surface of the via hole 9 is effectively prevented from being etched horizontally. Therefore, as shown in FIG. 7, it is possible to maintain the yield of 100% over the range. Further, in the present embodiment, since the contact area between the upper face of the underlying wiring layer 1 and tungsten filled in the via hole 9 is larger than that of the first embodiment as already described, it is possible to reduce the via hole resistance.

While the present invention has been particularly shown and described with reference to the preferred embodiments, it will be understood that the various changes and modifications will occur to those skilled in the art without departing from the scope and true spirit of the invention. The scope of the invention is therefore to be determined solely by the appended claims.

What is claimed is:

1. A semiconductor device comprising:
   a first insulating layer;
   a first wiring layer on said first insulating layer, said first wiring layer having a top surface;
   a second insulating layer over said first wiring layer;
   a second wiring layer on said second insulating layer;
   a first hole formed in said first wiring layer with a first size;
   a second hole formed in said second insulating layer with a second size that is larger than first size, a part of said top surface of said first wiring layer around said first hole being thereby exposed by said second hole; and
   a conductive material filling said first and second holes to electrically connect said first wiring layer to said second wiring layer, said conductive material terminating within said first insulating layer.

2. The semiconductor device as claimed in claim 1, wherein said first hole is in registration with said second hole.

3. The semiconductor device as claimed in claim 1, wherein said second insulating layer is formed in a part of said first hole.

4. The semiconductor device as claimed in claim 1, wherein said second insulating layer comprises a low dielectric film.

5. The semiconductor device as calimed in claim 4, wherein said low dielectric film is HSQ.

6. The semiconductor device as claimed in claim 5, wherein a width of said first wiring layer is greater than 250 μm.

7. The semiconductor device as claimed in claim 4, wherein said second insulating layer further comprises an insulating film on said low dielectric film, said insulating film having an etching rate that is lower than an etching rate of said low dielectric film.

8. The semiconductor device as claimed in claim 1, wherein said second insulating layer is an application film.

9. The semiconductor device as claimed in claim 1, further comprising a coating on an inner surface of both said first and second holes.

10. The semiconductor device as claimed in claim 9, wherein the coating is a titanium nitride layer.

11. The semiconductor device as claimed in claim 10, wherein the titanium nitride layer is about 50 nm thick.

12. A semiconductor device comprising:
    a first insulating layer;
    a first wiring layer on said first insulating layer, said first wiring layer having a top surface;
    a second insulating layer over said first wiring layer;
    a second wiring layer on said second insulating layer;
    a first hole formed in said first wiring layer, a side-wall surface being thereby formed in said first wiring layer to define said first hole;
    a second hole formed in said second insulating layer to expose a part of said side-wall surface of said first wiring layer and a part of said top surface of said first wiring layer around said first hole;
    said second insulating layer having an extended portion that fills one part of said first hole in contact with the remaining part of said side-wall surface of said first wiring layer; and
    a conductive material filling a remaining part of said first hole and said second hole in contact with said part of said side-wall surface of said first wiring layer and said part of said top surface of said first wiring layer to electrically connect said first wiring layer to said second wiring layer, said conductive material terminating within said first insulating layer.

13. A semiconductor device as claimed in claim 12, wherein said second insulating layer comprises a low dielectric film.

14. A semiconductor device as claimed in claim 13, wherein said low dielectric film is HSQ.

15. The semiconductor device as claimed in claim 13, wherein said second insulating layer further comprises an insulating film on said low dielectric film, said insulating film having an etching rate that is lower than an etching rate of said low dielectric film.

* * * * *